United States Patent
Yamaguchi et al.

(10) Patent No.: US 6,846,572 B2
(45) Date of Patent: Jan. 25, 2005

(54) CURABLE COMPOSITION, CURED PRODUCT, AND LAMINATE

(75) Inventors: Yoshikazu Yamaguchi, Ibaraki (JP); Takao Yashiro, Kawaguchi (JP); Isao Nishiwaki, Toride (JP); Takashi Ukachi, Kamiya (JP)

(73) Assignees: DSM IP Assets B.V., Heerlen (NL); JSR Corporation, Tokyo (JP); Japan Fine Coatings Co. Ltd., Tokyo (JP)

( * ) Notice: Subject to any disclaimer, the term of this patent is extended or adjusted under 35 U.S.C. 154(b) by 0 days.

(21) Appl. No.: 10/195,325

(22) Filed: Jul. 16, 2002

(65) Prior Publication Data

US 2003/0100630 A1 May 29, 2003

Related U.S. Application Data

(63) Continuation of application No. PCT/NL01/00028, filed on Jan. 16, 2001.

(30) Foreign Application Priority Data

Jan. 17, 2000 (JP) .......................................... 2000-010316

(51) Int. Cl.$^7$ .......................... B32B 27/42; C08F 30/04
(52) U.S. Cl. ........................ 428/524; 428/521; 428/522; 525/454; 525/455; 525/456; 525/518

(58) Field of Search ................................. 525/518, 455, 525/456, 454; 428/524, 521, 522

(56) References Cited

U.S. PATENT DOCUMENTS

| 3,899,611 A | | 8/1975 | Hall | |
| 4,499,217 A | | 2/1985 | Yoshimura et al. | |
| 4,719,146 A | | 1/1988 | Hohage et al. | |
| 5,026,816 A | * | 6/1991 | Keehan | ........................ 528/94 |
| 5,426,131 A | * | 6/1995 | Katsamberis | ................ 522/16 |

FOREIGN PATENT DOCUMENTS

EP 0 867 469 A 9/1998

* cited by examiner

*Primary Examiner*—Jeffrey B. Robertson
(74) *Attorney, Agent, or Firm*—Mayer, Brown, Rowe & Maw LLP

(57) ABSTRACT

The invention relates to a curable composition comprising (A) particles prepared by bonding at least one oxide of an element selected from the group consisting of silicon, aluminum, zirconium, titanium, zinc, germanium, indium, tin, antimony, and cerium, and an organic compound which comprises a polymerizable group, (B) a compound having a melamine group and one or more polymerizable groups and (C) a compound having at least two polymerizable groups in the molecule other than the component (B); and to cured products and laminates with a with low reflectance and superior chemical resistance.

16 Claims, No Drawings

CURABLE COMPOSITION, CURED PRODUCT, AND LAMINATE

This is a Continuation of International Application No. PCT/NL01/00028 filed Jan. 16, 2001 which designated the U.S.

DETAILED DESCRIPTION OF THE INVENTION

1. Field of the Invention

The present invention relates to a curable composition, a cured product and a laminate thereof. More particularly, the present invention relates to a curable composition exhibiting excellent applicability and capable of forming a coating (film) with high hardness, a high refractive index, superior scratch resistance, and excellent adhesion to substrates as well as a layer with a low refractive index on the surface of various substrates such as plastics (polycarbonate, polymethylmethacrylate, polystyrene, polyester, polyolefin, epoxy resins, melamine resins, triacetyl cellulose resins, ABS resins, AS resins, norbornene resins, etc.), metals, wood, papers, glasses, and slates. The present invention also relates to a cured product made from the curable composition and a laminate with low reflectance and superior chemical resistance. The curable composition, cured product, and laminate of the present invention are suitable for use as a protective coating material to prevent scratches or stains on plastic optical parts, touch panels, film-type liquid crystal elements, plastic containers, or flooring materials, wall materials, and artificial marbles which are used for architectural interior finish; an antireflection film for film-type liquid crystal elements, touch panels, or plastic optical parts; an adhesive or sealing material for various substrates, and a vehicle for printing ink; and the like. The curable composition, cured product, and laminate can be particularly suitable for an antireflection film.

2. Prior Art

In recent years, a curable composition exhibiting excellent applicability and capable of forming a cured film excelling in hardness, scratch resistance, abrasion resistance, low curling properties, adhesion, transparency, chemical resistance, and appearance is desired as a protective coating material to prevent scratches or stains on the surface of various substrates, an adhesive or sealing material for various substrates, or a vehicle for printing ink.

In addition to the above requirements, capability of forming a cured film with a high refractive index has been demanded for a curable composition used as an antireflection film for film-type liquid crystal elements, touch panels, or plastic optical parts.

Various types of compositions have been proposed to satisfy such demands. However, a curable composition satisfying the following characteristics (1) to (3) has not been developed yet: (1) a curable composition having excellent applicability; (2) a cured film produced thereof having high hardness, high refractive index, superior scratch resistance, and excellent adhesion to substrates and to films with a low refractive index; and (3) a laminate comprising the cured film and a film with a low refractive index applied thereon having low reflectance and superior chemical resistance.

For example, Japanese Patent Publication No. 21815/1987 proposed utilization of a composition comprising acrylate and particles of colloidal silica of which the surface is modified with methacryloxysilane for a radiation (photo) curable coating material. This type of radiation curable composition is recently used in a number of applications due to the excellent applicability and the like.

However, although a laminate formed by applying a film with a low refractive index to the cured product of such a composition exhibits an improved anti-reflection effect as an antireflection film, chemical resistance of the laminate was inadequate.

Problems to be Solved by the Invention

The present invention has been achieved in view of the above problems. An object of the present invention is to provide a curable composition exhibiting excellent applicability and capable of forming a coating (film) with high hardness, high refractive index, superior scratch resistance, and excellent adhesion to substrates and materials having a low refractive index, a cured product of the curable composition, and a laminate with low reflectance and superior chemical resistance.

Means for Solving the Problems

As a result of extensive studies to achieve the above object, the present inventors have found that a product satisfying all the above characteristics can be obtained by a curable composition comprising (A) particles prepared by bonding at least one oxide of an element selected from the group consisting of silicon, aluminum, zirconium, titanium, zinc, germanium, indium, tin, antimony, and cerium, and an organic compound which comprises a polymerizable group, (B) a compound having a melamine group and one or more polymerizable groups and (C) a compound having at least two polymerizable groups in the molecule other than the component (B).

PREFERRED EMBODIMENT OF THE INVENTION

The curable composition, and a cured product and a laminate thereof of the present invention will be described in more detail below.

I. Curable Composition

The curable composition comprises (A) particles prepared by bonding at least one oxide of an element selected from the group consisting of silicon, aluminum, zirconium, titanium, zinc, germanium, indium, tin, antimony, and cerium (hereinafter may be referred to as "oxide particles (A1)"), and an organic compound which comprises a polymerizable group (hereinafter may be referred to as "organic compound (A2)") (hereinafter may be referred to as "reactive particles (A)" or "component (A)"), (B) a compound having a melamine group and one or more polymerizable groups (hereinafter may be referred to as "compound (B)" or "component (B)"), and (C) a compound having at least two polymerizable unsaturated groups in the molecule other than the component (B) (hereinafter may be referred to as "compound (C)" or "component (C)").

Preferably, the curable composition of the present invention contains polymerizable groups of compounds (A), (B) and (C) that are polymerizable unsaturated groups.

Each component of the curable composition of the present invention will be described in more detail.

1. Reactive Particles (A)

The reactive particles (A) used in the present invention are produced by bonding the oxide particles (A1) of at least one element selected from the group consisting of silicon, aluminum, zirconium, titanium, zinc, germanium, indium, tin, antimony, and cerium, and the organic compound (A2) containing a polymerizable group (preferably an organic compound comprising the group shown by the formula (1).

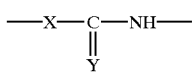

(1)

wherein X represents NH, O (oxygen atom), or S (sulfur atom), and Y represents O or S.

(1) Oxide Particles (A1)

For obtaining a colorless cured coating from the curable composition, the oxide particles (A1) used in the present invention should preferably be oxide particles of at least one element selected from the group consisting of silicon, aluminum, zirconium, titanium, zinc, germanium, indium, tin, antimony, and cerium.

Examples of these oxide particles (A1) are, particles of silica, alumina, zirconia, titanium oxide, zinc oxide, germanium oxide, indium oxide, tin oxide, indium-tin oxide (ITO), antimony oxide and cerium oxide. Of these, particles of silica, alumina, zirconia, and antimony oxide are preferable from the viewpoint of high hardness. These compounds may be used either individually or in combinations of two or more. The oxide particles (A1) are preferably in the form of a powder or a solvent dispersion sol. If the oxide particles are in the form of a solvent dispersion sol, an organic solvent is preferable as a dispersion medium from the viewpoint of mutual solubility with other components and dispersibility. Examples of such an organic solvent include alcohols such as methanol, ethanol, isopropanol, butanol, and octanol; ketones such as acetone, methyl ethyl ketone, methyl isobutyl ketone, and cyclohexanone; esters such as ethyl acetate, butyl acetate, ethyl lactate, and γ-butyrolactone, propylene glycol monomethyl ether acetate, and propylene glycol monoethyl ether acetate; ethers such as ethylene glycol monomethyl ether and diethylene glycol monobutyl ether; aromatic hydrocarbons such as benzene, toluene, and xylene; amides such as dimethylformamide, dimethylacetamide, and N-methylpyrrolidone; and the like. Of these, methanol, isopropanol, butanol, methyl ethyl ketone, methyl isobutyl ketone, ethyl acetate, butyl acetate, toluene, and xylene are preferable.

The number average particle diameter of the oxide particles (A1) is from 0.001 μm to 2 μm, preferably from 0.001 μm to 0.2 μm, and still more preferably from 0.001 μm to 0.1 μm. If the number average particle diameter is more than 2 μm, transparency of the cured product and the surface conditions of the film tend to be impaired. Moreover, various surfactants and amines may be added to improve dispersibility of particles.

Among silicon oxide particles, given as examples of commercially available products of silica particles are colloidal silica available under the trade names Methanol Silica Sol, IPA-ST, MEK-ST, NBA-ST, XBA-ST, DMAC-ST, ST-UP, ST-OUP, ST-20, ST-40, ST-C, ST-N, ST-O, ST-50, ST-OL, (all manufactured by Nissan Chemical Industries, Ltd.), and the like. As powdery silica, products available under the trade names AEROSIL 130, AEROSIL 300, AEROSIL 380, AEROSIL TT600, and AEROSIL OX50 (manufactured by Japan Aerosil Co., Ltd.), Sildex H31, H32, H51, H52, H121, H122 (manufactured by Asahi Glass Co., Ltd.), E220A, E220 (manufactured by Nippon Silica Industrial Co., Ltd.), SYLYSIA470 (manufactured by Fuji Silycia Chemical Co., Ltd.) and SG Flake (manufactured by Nippon Sheet Glass Co., Ltd.), and the like can be given.

Given as commercially available products of aqueous dispersion products of alumina are Alumina Sol-100, -200, -520 (manufactured by Nissan Chemical Industries, Ltd.); as an isopropanol dispersion of alumina, AS-150I (manufactured by Sumitomo Osaka Cement Co., Ltd.); as a toluene dispersion of alumina, AS-150T (manufactured by Sumitomo Osaka Cement Co., Ltd.); as a toluene dispersion of zirconia, HXU-110JC (manufactured by Sumitomo Osaka Cement Co., Ltd.); as an aqueous dispersion product of zinc antimonate powder, Celnax (manufactured by Nissan Chemical Industries, Ltd.); as powders and solvent dispersion products of alumina, titanium oxide, tin oxide, indium oxide, zinc oxide, etc., Nano Tek, for example, (manufactured by CI Kasei Co., Ltd.); as an aqueous dispersion sol of antimony dope-tin oxide, SN-100D (manufactured by Ishihara Sangyo Kaisha, Ltd.); as an ITO powder, a product manufactured by Mitsubishi Material Co., Ltd.; and as an aqueous dispersion of cerium oxide, Needral (manufactured by Taki Chemical Co., Ltd.).

The shape of oxide particles (A1) may be globular, hollow, porous, rod-like, plate-like, fibrous, or amorphous, with a globular shape being preferable. The specific surface of the oxide particles (A1) determined by the BET method using nitrogen is preferably in the range of 10 to 1000 m$^2$/g, and more preferably 100 to 500 m$^2$/g. The oxide particles (A1) can be used either in the form of a dry powder or a dispersion in water or an organic solvent. For example, a dispersion liquid of fine particles of oxide known in the art as a solvent dispersion sol of these oxides can be used. Use of a solvent dispersion sol of oxide is particularly preferable in the application in which excellent transparency of cured products is required.

(2) Organic Compound (A2)

The organic compound (A2) used in the present invention is preferably a compound having a polymerizable unsaturated group in the molecule, and more preferably a specific organic compound comprising the group [—X—C(=Y)—NH—] shown by the above formula (1). The organic compound (A2) preferably comprises a group represented by [—O—C(=O)—NH—] and at least one of the groups represented by [—O—C(=S)—NH—] and [—S—C(=O)—NH—]. It is preferable that the organic compound (A2) have a silanol group in the molecule or form a silanol group by hydrolysis.

1) Polymerizable Unsaturated Group

There are no specific limitations to the preferred polymerizable unsaturated groups included in the organic compound (A2). An acryloyl group, methacryloyl group, vinyl group, propenyl group, butadienyl group, styryl group, ethynyl group, cinnamoyl group, malate group, and acrylamide group can be given as preferable examples.

This polymerizable unsaturated group is a structural unit to effect an addition polymerization by active radicals.

2) Group Shown by the Above Formula (1)

There are six types for the group [—X—C(=Y)—NH—] of the formula (1) contained in the specific organic compound, specifically, they are [—O—C(=O)—NH—], [—O—C(=S)—NH—], [—S—C(=O)—NH—], [—NH—C(=O)—NH—], [—NH—C(=S)—NH—], and [—S—C(=S)—NH—]. These groups may be used either individually or in combinations of two or more. Of these, the combined use of the group [—O—C(=O)—NH—] and at least one of the groups [—O—C(=S)—NH—] and [—S—C(=O)—NH—] is preferable for ensuring excellent heat stability.

The group [—X—C(=Y)—NH—] of the formula (1) is considered to generate a moderate cohesive force by a hydrogen bond among molecules, which provides the cured product with characteristics such as superior mechanical strength, excellent adhesion to substrates, and good heat resistance.

3) Silanol Group or a Group which Forms a Silanol Group by Hydrolysis

The organic compound (A2) is preferably a compound having a silanol group (hereinafter may be referred to as "silanol group-containing compound") or a compound which forms a silanol group by hydrolysis (hereinafter may be referred to as "silanol group-forming compound"). As the silanol group-forming compound, a compound having an alkoxy group, aryloxy group, acetoxy group, amino group, a halogen atom, or the like on a silicon atom can be given, with a compound including an alkoxy group or aryloxy group on a silicon atom, specifically, an alkoxysilyl group-containing compound or an aryloxysilyl group-containing compound being preferable.

The silanol group or the silanol group-forming site of the silanol group-forming compound is the structural unit which bonds with the oxide particles (A1) by condensation or condensation following hydrolysis.

4) Preferable Embodiment

The compound shown by the following formula (4) can be given as a preferable specific example of the organic compound (A2):

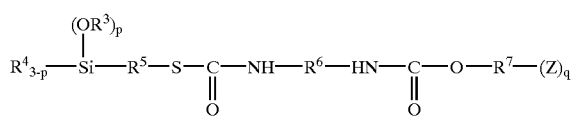

(4)

wherein $R^3$ and $R^4$ individually represent a hydrogen atom or an alkyl group or aryl group having 1–8 carbon atoms such as a methyl group, ethyl group, propyl group, butyl group, octyl group or an arylgroup having 6–12 C atoms for example a phenyl group or xylyl group; $R^5$ is a divalent organic group having between 1 and 12 C atoms and has an aliphatic structure (which may be linear, branched, or cyclic) or an aromatic structure; $R^6$ is a divalent organic group having a molecular weight from 14 to 10,000, preferably from 76 to 500; $R^7$ is an organic group of a (q+1) valence and preferably selected from the group consisting of linear, branched, or cyclic, saturated or unsaturated hydrocarbon groups; $R^3$, $R^4$, $R^5$, $R^6$ and $R^7$ may contain hetero atoms like for example O, N, S, P; Z is a monovalent organic group having a polymerizable unsaturated group in the molecule which causes an inter-molecular cross-linking reaction in the presence of reactive radicals; q is an integer preferably from 1 to 20, and more preferably from 1 to 10, and most preferably from 1 to 5; and p is an integer from 1–3.

Examples of the group represented by $[(R^3O)_p R^4_{3-p}Si—]$, are a trimethoxy silyl group, triethoxy silyl group, triphenoxy silyl group, methyldimethoxy silyl group and dimethylmethoxy silyl group. Of these groups, trimethoxysilyl group, triethoxysilyl group, and the like are most preferred.

Examples of organic groups Z are an acryloyl group, methacryloyl group, vinyl group, propenyl group, butadienyl group, styryl group, ethynyl group, cinnamoyl group, malate group, and acrylamide group.

The organic compound (A2) used in the present invention can be synthesized using a method described in Japanese Patent Application Laid-open No. 100111/1997, for example.

The proportion of the organic compound (A2) bonded to the oxide particles (A1) is preferably 0.01 wt % or more, more preferably 0.1 wt % or more, and particularly preferably 1 wt % or more, of 100 wt % of the reactive particles (A) (total weight of oxide particles (A1) and organic compound (A2)). If the proportion is less than 0.01 wt %, dispersibility of the reactive particles (A) in the composition may be inadequate, whereby transparency and scratch resistance of the resulting cured product may be impaired. The proportion of the oxide particles (A1) among the raw materials in the preparation of the reactive particles (A) is preferably 5–99 wt %, and still more preferably 10–98 wt %.

The proportion (content) of the reactive particles (A) to be incorporated in the composition is preferably 5–90 wt %, and still more preferably 65–85 wt % of 100 wt % of the composition (total weight of reactive particles (A), compound (B), and compound (C)). If the proportion is less than 5 wt %, products with a high refractive index may not be obtained. If the proportion is more than 90 wt %, film formability may be inadequate.

The content of the oxide particles (A1) constituting the reactive particles (A) in the composition is preferably 65–90 wt %.

The content of the reactive particles (A) refers to the solid content, which does not include the amount of solvents when used in the form of a solvent dispersion sol.

2. Compound (B)

The compound (B) of the present invention is a compound having a melamine group and one or more polymerizable groups.

Examples of suitable polymerizable groups are (meth)acrylate, epoxy and vinylether groups.

Preferably compound (B) used in the present invention is a melamine (meth)acrylate compound. More preferably compound (B) is at least one of the compounds shown by formulas (2) and (3):

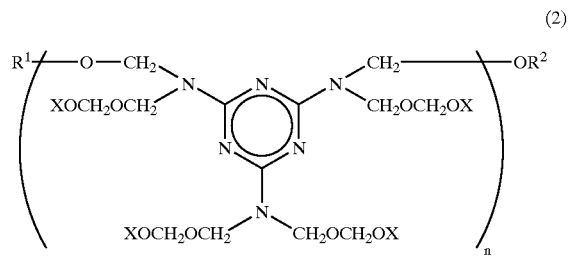

(2)

wherein $R^1$ and $R^2$ represent a $C_1$–$C_{10}$ alkyl group or a (meth)acryloyloxyalkyl group, each X individually represents a $C_1$–$C_{10}$ alkyl group or a (meth)acryloyloxyalkyl group, provided that at least one X among 4n Xs is a (meth)acryloyloxyalkyl group, and n is an integer from 1 to 20;

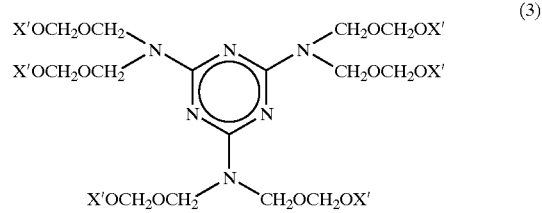

(3)

wherein each X' individually represents a $C_1$–$C_{10}$ alkyl group or a (meth)acryloyloxyalkyl group, with one to five X's among six X's being a lower alkyl group.

Most preferred, the compound (B) is a condensation product made from (i) 2-hydroxyethyl acrylate and (ii) the condensation product of melamine, formaldehyde, and an alkyl monohydric alcohol having 1–12 carbon atoms.

The compound (B) is suitably used to increase the refractive index of the cured product and improve chemical resistance of the laminate.

Preferred examples of a $C_1$–$C_{10}$ alkyl group represented by $R^1$, $R^2$, X, and X' in the above formulas (2) and/or (3) are a methyl group, ethyl group, n-propyl group and isopropyl group.

$R^1$ and $R^2$ are preferably a methyl group for ensuring excellent curability.

Examples of a (meth)acryloyloxyalkyl group represented by X and X' are an acryloyloxyethyl group, methacryloyloxyethyl group, acryloyloxyisopropyl group, methacryloyloxyisopropyl group, acryloyloxybutyl group and methacryloyloxybutyl group.

Examples of commercially available products of the compound (B) are SETACURE 591 (manufactured by Akzo) and NIKALAC MX-302 (manufactured by Sanwa Chemical Industry Co., Ltd.).

The number average molecular weight of the compound (B) used in the present invention is preferably from 500 to 20,000. A number average molecular weight of less than 500 results in a decrease of chemical resistance of the resulting laminate. A number average molecular weight of more than 20,000 results in a decrease of the applicability.

The proportion of the compound (B) used in the present invention is preferably 0.01–30 wt %, and still more preferably 1–15 wt % of 100 wt % of the composition (total weight of reactive particles (A), compound (B), and compound (C)). If the proportion is less than 0.01 wt %, chemical resistance of the resulting laminate may be impaired. If more than 30 wt %, hardness of the cured product may decrease.

3. Compound (C)

Preferably compound (C) used in the present invention is a compound having two or more polymerizable unsaturated groups in the molecule other than the compound (B). The compound (C) is suitably used to increase film formability of the composition. Although there are no specific limitations to the compound (C) insofar as the compound has two or more polymerizable groups in the molecule, (meth)acrylic esters, vinyl compounds, and the like can be given as examples. Of these, (meth)acrylic esters are preferable.

The following compounds can be given as specific examples of the compound (C) used in the present invention.

Examples of (meth)acrylic esters are trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerol tri(meth)acrylate, tris(2-hydroxyethyl) isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, and bis(2-hydroxyethyl)isocyanurate di(meth)acrylate, poly(meth)acrylates of ethylene oxide or propylene oxide addition product to starting alcohols of these (meth)acrylates, oligoester (meth)acrylates, oligoether (meth)acrylates, oligourethane (meth)acrylates, and oligoepoxy (meth)acrylates having two or more (meth)acryloyl groups in the molecule. Of these, dipentaerythritol hexa(meth)acrylate, dipentaerythritol penta(meth)acrylate, pentaerythritol tetra(meth)acrylate, and ditrimethylolpropane tetra(meth)acrylate are preferable.

Examples of vinyl compounds are divinylbenzene, ethylene glycol divinyl ether, diethylene glycol divinyl ether and triethylene glycol divinyl ether.

Examples of commercially available products of the compound (C) are Aronix M-400, M-408, M-450, M-305, M-309, M-310, M-315, M-320, M-350, M-360, M-208, M-210, M-215, M-220, M-225, M-233, M-240, M-245, M-260, M-270, M-1100, M-1200, M-1210, M-1310, M-1600, M-221, M-203, TO-924, TO-1270, TO-1231, TO-595, TO-756, TO-1343, TO-902, TO-904, TO-905, TO-1330 (manufactured by Toagosei Co., Ltd.); KAYARAD D-310, D-330, DPHA, DPCA-20, DPCA-30, DPCA-60, DPCA-120, DN-0075, DN-2475, SR-295, SR-355, SR-399E, SR-494, SR-9041, SR-368, SR-415, SR-444, SR-454, SR-492, SR-499, SR-502, SR-9020, SR-9035, SR-111, SR-212, SR-213, SR-230, SR-259, SR-268, SR-272, SR-344, SR-349, SR-601, SR-602, SR-610, SR-9003, PET-30, T-1420, GPO-303, TC-120S, HDDA, NPGDA, TPGDA, PEG400DA, MANDA, HX-220, HX-620, R-551, R-712, R-167, R-526, R-551, R-712, R-604, R-684, TMPTA, THE-330, TPA-320, TPA-330, KS-HDDA, KS-TPGDA, KS-TMPTA (manufactured by Nippon Kayaku Co., Ltd.); Light Acrylate PE-4A, DPE-6A, DTMP-4A (manufactured by Kyoeisha Chemical Co., Ltd.).

The proportion of the compound (C) used in the present invention is preferably 10–80 wt %, and still more preferably 20–75 wt % of 100 wt % of the composition (total weight of reactive particles (A), compound (B), and compound (C)). If the proportion is less than 10 wt % or exceeds 80 wt %, a cured product with high hardness may not be obtained.

In addition, a compound having one polymerizable unsaturated group in the molecule may be added to the composition of the present invention other than the compound (C), as required.

4. Acid Generator

In addition to the reactive particles (A), compound (B), and compound (C), (D) an acid generator (hereinafter referred to as "acid generator (D)") may be added to the composition of the present invention, as required.

As examples of the acid generator (D), a compound which thermally generates cations and a compound which generates cations upon irradiation with radioactive rays (light) known in the art can be given.

As examples of a compound which thermally generates cations, aliphatic sulfonic acid, aliphatic sulfonate, aliphatic carboxylic acid, aliphatic carboxylate, aromatic carboxylic acid, aromatic carboxylate, alkylbenzene sulfonic acid, alkylbenzene sulfonate, phosphate, metal salt, and the like can be given.

These compounds may be used either individually or in combinations of two or more.

As preferable examples of a compound which generates cations upon irradiation, an onium salt having a structure shown by the following formula (5) can be given.

This onium salt is a compound which liberates a Lewis acid upon exposure to light.

$$[R^8{}_d R^9{}_e R^{10}{}_f R^{11}{}_g W]^{+j}[MY_{j+k}]^{-j} \qquad (5)$$

wherein a cation is an onium ion; W is S, Se, Te, P, As, Sb, Bi, O, I, Br, Cl, or —N≡N; $R^8$, $R^9$, $R^{10}$, and $R^{11}$ are the same or different organic groups; d, e, f, and g are individually integers from 0 to 3, provided that (d+e+f+g) is equal to the valence of W; M is a metal or a metalloid which constitutes a center atom of the halide complex $[MX_{j+k}]$ such as B, P, As, Sb, Fe, Sn, Bi, Al, Ca, In, Ti, Zn, Sc, V, Cr, Mn, and Co; Y is a halogen atom such as F, Cl, and Br; j is a net charge of a halide complex ion; and k is a valence.

As specific examples of an anion $[MX_{j+k}]$ in the formula (5), tetrafluoroborate ($BF_4^-$), hexafluorophosphate ($PF_6^-$), hexafluoroantimonate ($SbF_5^-$), hexafluoroarsenate ($AsF_6^-$) and hexachloroantimonate ($SbCl_6^-$) can be given.

In addition, an onium salt having an anion of the formula [MY$_k$(OH)$^-$] can also be used. Moreover, onium salts having other anions such as a perchloric acid ion (ClO$_4^-$), trifluoromethanesulfonic acid ion (CF$_3$SO$_3^-$), fluorosulfonic acid ion (FSO$_3^-$), toluenesulfonic acid ion, trinitrobenzenesulfonic acid anion, and trinitrotoluenesulfonic acid anion can be used.

Of these onium salts, an aromatic onium salt is particularly effective as the acid generator (D). Particularly preferable onium salts are aromatic halonium salts disclosed in Japanese Patent Applications Laid-open No. 151996/1975 and No. 158680/1975, VIA group aromatic onium salts disclosed in Japanese Patent Applications Laid-open No. 151997/1975, No. 30899/1977, No. 55420/1981, and No. 125105/1980; VA group aromatic onium salts disclosed in Japanese Patent Application Laid-open No. 158698/1975; oxosulfoxonium salts disclosed in Japanese Patent Applications Laid-open No. 8428/1981, No. 149402/1981, and No. 192429/1982; aromatic diazonium salts disclosed in Japanese Patent Application Laid-open No. 17040/1974 and thiopyrylium salts disclosed in U.S. Pat. No. 4,139,655. In addition, iron/allene complex initiators, aluminum complex/photolysis silicon compound initiators can also be given as examples.

These onium salts may be used either individually or in combinations of two or more.

As examples of commercially available products suitably used as the acid generator (D), UVI-6950, UVI-6970, UVI-6974, UVI-6990 (manufactured by Union Carbide Corp.), Adekaoptomer SP-150, SP-151, SP-170, SP-171 (manufactured by Asahi Denka Kogyo Co., Ltd.), Irgacure 261 (manufactured by Ciba Specialty Chemicals Co., Ltd.), CI-2481, CI-2624, CI-2639, CI-2064 (manufactured by Nippon Soda Co., Ltd.), CD-1010, CD-1011, CD-1012 (manufactured by Sartomer Co., Ltd.), DTS-102, DTS-103, NAT-103, NDS-103, TPS-103, MDS-103, MPI-103, BBI-103 (manufactured by Midori Chemical Co., Ltd.), PCI-061T, PCI-062T, PCI-020T, PCI-022T (manufactured by Nippon Kayaku Co., Ltd.), and the like can be given. Of these, UVI-6970, UVI-6974, UVI-6990, Adekaoptomer SP-150, SP-170, SP-171, CD-1012, and MPI-103 are particularly preferable for providing excellent surface curability to the resulting curable composition.

The amount of the acid generator (D) which is optionally used in the composition of the present invention is preferably 0.01–20 parts by weight, and still more preferably 0.1–10 parts by weight for 100 parts by weight of the composition (total weight of reactive particles (A), compound (B), and compound (C)). If the amount is less than 0.01 parts by weight, film formability may be inadequate. If the amount is more than 20 parts by weight, a cured product with high hardness may not be obtained.

5. Radical Polymerization Initiator (E)

In addition to the reactive particles (A), compound (B), and compound (C), (E) a radical polymerization initiator (hereinafter may be referred to as "radical polymerization initiator (E)") may be added to the composition of the present invention, as required.

As examples of the radical polymerization initiator (E), a compound which thermally generates active radicals (heat polymerization initiator) and a compound which generates active radicals upon irradiation with radioactive rays (light) (radiation (photo) polymerization initiator) known in the art can be given.

There are no specific limitations to the radiation (photo) polymerization initiator insofar as such an initiator decomposes upon irradiation and generates radicals to initiate polymerization. Examples of such an initiator include acetophenone, acetophenone benzyl ketal, 1-hydroxycyclohexyl phenyl ketone, 2,2-dimethoxy-1,2-diphenylethan-1-one, xanthone, fluorenone, benzaldehyde, fluorene, anthraquinone, triphenylamine, carbazole, 3-methylacetophenone, 4-chlorobenzophenone, 4,4'-dimethoxybenzophenone, 4,4'-diaminobenzophenone, benzoin propyl ether, benzoin ethyl ether, benzyl dimethyl ketal, 1-(4-isopropylphenyl)-2-hydroxy-2- methylpropan-1-one, 2-hydroxy-2-methyl-1-phenylpropan-1-one, thioxanethone, diethylthioxanthone, 2-isopropylthioxanthone, 2-chlorothioxanthone, 2-methyl-1-[4-(methylthio)phenyl]-2-morpholino-propan-1-one, 2-benzyl-2-dimethylamino-1-(4-morpholinophenyl)-butanone-1,4-(2-hydroxyethoxy) phenyl-(2-hydroxy-2-propyl)ketone, 2,4,6-trimethylbenzoyl diphenylphosphine oxide, bis-(2,6-dimethoxybenzoyl)-2,4, 4-trimethylpentylphosphine oxide, and oligo(2-hydroxy-2-methyl-1-(4-(1-methylvinyl)phenyl)propanone).

As examples of commercially available products of the radiation (photo) polymerization initiator, Irgacure 184, 369, 651, 500, 819, 907, 784, 2959, CGI1700, CGI1750, CGI1850, CG24-61, Darocur 1116, 1173 (manufactured by Ciba Specialty Chemicals Co., Ltd.), Lucirin TPO (manufactured by BASF), Ubecryl P36 (manufactured by UCB), Ezacure KIP150, KIP65LT, KIP100F, KT37, KT55, KTO46, KIP75/B (manufactured by Lamberti), and the like can be given.

The amount of the radical polymerization initiator (E) optionally used in the present invention is preferably 0.01–20 parts by weight, and still more preferably 0.1–10 parts by weight for 100 parts by weight of the composition (total weight of reactive particles (A), compound (B), and compound (C)). If the amount is less than 0.01 parts by weight, hardness of the cured product may be inadequate. If the amount is more than 20 parts by weight, the inner layer may remain uncured during curing operation.

When curing the composition of the present invention, a photo-polymerization initiator and a heat-polymerization initiator can be used in combination, as required.

As preferable examples of a heat-polymerization initiator, peroxides, azo compounds, and like can be given. Specific examples include benzoyl peroxide, t-butyl-peroxybenzoate, azobisisobutyronitrile, and the like.

6. Method of Applying the Composition

The composition of the present invention can suitably be used as an antireflection film or a coating material. Examples of substrates to which the composition can be applied are plastics (polycarbonate, polymethacrylate, polystyrene, polyester, polyolefin, epoxy resins, melamine resins, triacetyl cellulose resins, ABS resins, AS resins and norbornene resins), metals, wood, papers, glass, slates, and the like can be given. Such a substrate may be in the shape of a plate, film, or three-dimensional formed body. Conventional coating methods such as for example dip coating, spray coating, flow coating, shower coating, roll coating, brush coating, can be employed as a coating method. The thickness of the film after drying and curing is generally 0.1–400 μm, and preferably 1–200 μm.

In order to adjust the film thickness, the composition of the present invention can be used by diluting with a solvent. For example, when used as an antireflection film or a coating material, the viscosity of the composition is usually 0.1–50, 000 mPa·s/25° C., and preferably 0.5–10,000 mPa·s/25° C.

7. Method of Curing the Composition

The composition of the present invention is cured by heat and/or radioactive rays (light). In the case of curing the composition by heat, an electric heater, infrared ray lamp, hot blast, and the like can be used as the heat source. In the case of curing the composition using radioactive rays (light), there are no specific limitations to the source of the radioactive rays insofar as the composition can be cured in a short period of time after coating. As examples of the source of infrared rays, a lamp, resistance heating plate, laser, and the like can be given. As examples of the source of visible rays, sunlight, a lamp, fluorescent lamp, laser, and the like can be given. As the source of ultraviolet rays, a mercury lamp, halide lamp, laser, and the like can be given. As examples of the source of electron beams, a system of utilizing thermoelectrons produced by a commercially available tungsten filament, a cold cathode method generating electron beams by passing a high voltage pulse through a metal, and a secondary electron method which utilizes secondary electrons produced by the collision of ionized gaseous molecules and a metal electrode can be given. As the source of α-rays, β-rays, and γ-rays, for example, fissionable substances such as $Co^{60}$ and the like can be given. For γ-rays, a vacuum tube which causes an acceleration electron to collide with an anode and the like can be utilized. These radioactive rays can be used either individually or in combination of two or more. In the latter case, the two or more radioactive rays may be used either simultaneously or at certain intervals of time.

II. Cured Product

The cured product of the present invention can be obtained by applying the curable composition to various substrates such as a plastic substrate, and curing the composition. Specifically, the cured product can be obtained as a coating body by applying the composition to a substrate, removing volatile components from the composition by drying, preferably at 0–200° C., and then curing the composition using heat and/or radioactive rays. Curing using heat is preferably performed at 20–150° C. for 10 seconds to 24 hours. When using radioactive rays, use of ultraviolet rays or electron beams is preferable. The dose of ultraviolet rays is preferably 0.01–10 $J/cm^2$, and still more preferably 0.1–2 $J/cm^2$. Electron beams are preferably irradiated with an applied voltage of 10–300 KV and an electron density of 0.02–0.30 $mA/cm^2$ at a dose of 1–10 Mrad.

Since the cured product of the present invention has high hardness and a high refractive index and is capable of forming a coating (film) exhibiting excellent scratch resistance and superior adhesion to substrates as well as a layer with a low refractive index, the cured product is particularly suitable as an antireflection film for film-type liquid crystal elements, touch panels, or plastic optical parts.

III. Laminate

The laminate of the present invention is formed by laminating a cured film produced by curing the curable composition on a substrate, and then laminating a film with a low refractive index on the cured film. The laminate particularly suitable as an antireflection film.

There are no specific limitations to the substrate used in the present invention. When used as an antireflection film, substrates made of plastics (polycarbonate, polymethylmethacrylate, polystyrene, polyester, polyolefin, epoxy resins, melamine resins, triacetyl cellulose resins, ABS resins, AS resins, norbornene resins, and the like) can be given as examples.

As examples of the film with a low refractive index used in the present invention, films made of metal oxides such as magnesium fluoride and silicon dioxide, cured films of fluorine-type coating materials with a refractive index of 1.38–1.45, and the like can be given.

Vacuum deposition and sputtering are suitable methods of forming a film of a metal oxide having a low refractive index on the cured film having a high refractive index produced by curing the curable composition. The same methods can be used to apply a fluorine-type coating material to the cured film.

The reflection of light from the surface of the substrate can be effectively prevented by applying the composition of the present invention on the substrate, curing the composition by applying heat or radiation to the composition and applying the film with a low refractive index on the cured film.

The laminate of the present invention is particularly suitable as an antireflection film for film-type liquid crystal elements, touch panels, or plastic optical parts due to low reflectance and excellent chemical resistance.

EXAMPLES

The present invention will be described in more detail by examples, which should not be construed as limiting the present invention. In the following examples, "parts" and "%" respectively refer to "parts by weight" and "wt %" unless otherwise indicated.

In the present invention, "solid content" refers to the content of components excluding volatile components such as solvents from the dispersion liquid, specifically, "solid content" refers to the content of a residue (nonvolatile components) obtained by drying the composition on a hot plate at 175° C. for one hour.

Synthesis of Organic Compound (A2)

Synthesis Example 1

20.6 parts of isophorone diisocyanate was added to a solution of 7.8 parts of mercaptopropyltrimethoxysilane and 0.2 part of dibutyltin dilaurate in dry air in one hour while stirring at 50° C. The mixture was then stirred for a further three hours at 60° C. After the addition of 71.4 parts of pentaerythritol triacylate dropwise in one hour at 30° C., the mixture was stirred for a further three hours at 60° C. while heating to obtain an organic compound (A2-1). The amount of isocyanate remaining in the product was analyzed to find that the amount was 0.1% or less, indicating that the reaction was completed almost quantitatively.

Preparation of Reactive Particles (A)

Preparation Examples 1 and 2 illustrate examples of preparing reactive particles (A). The results are summarized in Table 1.

Preparation Example 1

A mixture of 2.1 parts of the organic compound (A2-1) prepared in Synthesis Example 1, 97.9 parts of methyl ethyl ketone zirconia sol (number average particle diameter: 0.01 µm, zirconia concentration: 30%), 0.1 part of ion-exchanged water, and 24.5 parts of methyl ethyl ketone was stirred at 60° C. for 3 hours, followed by the addition of 1.0 part of methyl orthoformate. The mixture was stirred for one hour while heating at 60° C. to obtain a dispersion liquid of reactive particles (A) (dispersion liquid (A-1)). The solid content of this dispersion liquid (A-1) was 25%.

Preparation Example 2

A mixture of 4.8 parts of the organic compound (A2-1) synthesized in Synthesis Example 1, 95.2 parts of isopropanol alumina sol (AS-150I manufactured by Sumitomo Osaka Cement Co., Ltd., number average particle diameter: 0.013 µm, alumina concentration: 15%,), 0.01 part of p-methoxyphenol, and 0.1 part of ion-exchanged water was stirred at 60° C. for 3 hours. After the addition of 1.0 part of methyl orthoformate, the mixture was stirred for one hour while heating at 60° C. to obtain a dispersion liquid of reactive particles (A) (dispersion liquid (A-2)). The solid content of this dispersion liquid (A-2) was 19%.

TABLE 1

|  | Preparation Example | |
| --- | --- | --- |
|  | 1 | 2 |
| Dispersion liquid of reactive particles (A) | A-1 | A-2 |
| Oxide particle sol (A1) | | |
| A1-1 | 97.9 | — |
| A1-2 | — | 95.2 |
| Organic compound (A2) | | |
| A2-1 | 2.1 | 4.8 |
| Ion-exchanged water | 0.1 | 0.1 |
| Methyl ethyl ketone | 24.5 | — |
| Methyl orthoformate | 1.0 | 1.0 |
| p-Methoxyphenol | — | 0.01 |
| Solid content (%) | 25 | 19 |
| Proportion of oxide particles among solid content (%) | 93 | 75 |

The meanings for the symbols in Table 1 are as follows.

A-1: Dispersion liquid of reactive particles (A) prepared in Preparation Example 1
A-2: Dispersion liquid of reactive particles (A) prepared in Preparation Example 2
A1-1: Methyl ethyl ketone zirconia sol (zirconia concentration: 30%)
A1-2: Isopropanol alumina sol (alumina concentration: 15%)
A2-1: Organic compound synthesized in Synthesis Example 1

Preparation Examples of Composition

Examples 1–4 and Comparative Examples 1–3 illustrate preparation examples of the composition of the present invention. The weight ratio of each component is shown in Table 2.

Example 1

305.6 parts of the dispersion liquid (A-1) prepared in the Preparation Example 1 (reactive particles: 76.4 parts, dispersion medium: methyl ethyl ketone (MEK)), 5.2 parts of melamine acrylate (NIKALAC MX-302 manufactured by Sanwa Chemical Industries Co., Ltd.) 18.4 parts of dipentaerythritol hexacrylate, 4.7 parts of an acid generator (CYRACURE UVI-6974 manufactured by Union Carbide Corp.) were stirred at 50° C. for two hours in a dry air stream to obtain a composition in the form of a homogeneous solution. The solid content of the composition determined in the same manner as in the Preparation Example 1 was 31%.

Examples 2–4

Compositions of Examples 2–4 were prepared in the same manner as in Example 1 except for using the components shown in Table 2.

Comparative Examples 1–2

Compositions of Comparative Examples 1 and 2 were prepared in the same manner as in Example 1 except for using the components shown in Table 2.

Evaluation of Cured Product and Laminate

To demonstrate the effects of the composition of the present invention, cured products obtained by applying, drying, and irradiating the above compositions and laminated bodies were evaluated. Evaluation methods are described below. The results of the evaluation are shown in Table 2.

1. Conditions of Application, Drying, and Curing
(1) Cured Product
Each composition obtained in Examples 1–4 and Comparative Examples 1–2 was applied to a substrate using a bar coater so that the thickness after drying was 5 μm. The composition was dried at 80° C. in a hot blast oven for 3 minutes and then irradiated at a dose of 1 J/cm² using a conveyer-type mercury lamp to obtain a cured product. The pencil hardness, refractive index, adhesion to substrates, and steel wool (SW) scratch resistance of the cured product were evaluated. Moreover, adhesion of the cured product to a layer with a low refractive index, which was the upper layer, was evaluated using a laminate described below. The results are shown in Table 2.

As the substrate, glass was used for evaluation of pencil hardness. For evaluation of adhesion to substrates and steel wool (SW) scratch resistance, a polyethylene terephthalate (PET) film with a thickness of 188 μm was used.

(2) Laminate
Each composition obtained in Examples 1–4 and Comparative Examples 1–2 was applied to a substrate using a bar coater so that the thickness after drying was 5 μm. The composition was dried at 80° C. in a hot blast oven for 3 minutes and then irradiated at a dose of 1 J/cm² using a conveyer-type mercury lamp to obtain a cured product. A coating material for a layer with a low refractive index (OPSTAR JN7215 manufactured by JSR Corporation) was applied to the cured product using a bar coater so that the thickness after drying was 0.1 μm, and dried in a hot blast oven at 120° C. for 30 minutes to obtain a laminate. Reflectance and chemical resistance were evaluated for the resulting laminate sample using the following method. The results are shown in Table 2.

2. Evaluation Method
(1) Cured Product
Pencil Hardness
Films cured on the glass substrate were evaluated according to JIS K5400.

Refractive Index
Each composition obtained in Examples 1–4 and Comparative Examples 1–2 was applied to a Teflon plate using a bar coater and dried at 80° C. in a hot blast oven for 3 minutes. These steps were repeated until the film thickness after drying was 30 μm. The dried composition was then irradiated at a dose of 1 J/cm² using a conveyer-type mercury lamp to obtain a cured product. The refractive index of the cured product removed from the Teflon plate was evaluated according to JIS K7105.

Adhesion to Substrate
According to a cellophane tape cross-cut peeling test prescribed in JIS K5400, adhesion to substrates was evaluated by the percentage of the number of 1 mm×1 mm squares remaining among 100 squares.

Adhesion to Layer with Low Refractive Index
The surface of the above laminate sample was rubbed 25 times with a load of 9.8 N/cm² using Kim Wipe Paper manufactured by Jujo Kimberly Co., Ltd. The degree of peeling of the surface was evaluated by naked eye observation. The case where no peeling was observed was evaluated as "Good", and the case where peelings were observed was evaluated as "Bad".

Steel Wool (SW) Scratch Resistance

A Gakushin-type abrasion resistance tester (manufactured by Tester Industry Co., Ltd.) was reciprocated 30 times using #0000 steel wool with a load of 500 g to evaluate the scratch conditions on the surface of the film by naked eye observation. The case where no scratch was observed was evaluated as "Good", and the case where a scratch was observed was evaluated as "Bad".

(2) Laminate

Reflectance

The laminate for an antireflection film prepared by the above method was installed on a 60 mmΦ integrating-sphere spectrophotometer (U-3410 manufactured by Hitachi, Ltd.) to measure the reflectance of the antireflection film.

Chemical Resistance

The surface of the antireflection film was rubbed 25 times with a load of 9.8 N/cm$^2$ using Kim Wipe Paper manufactured by Jujo Kimberly Co., Ltd. which was impregnated with ethanol. Scratches on the surface of the antireflection film were evaluated by naked eye observation. The case where no scratch was observed was evaluated as "Good", and the case where a scratch was observed or the surface was removed due to abrasion was evaluated as "Bad".

A-1-1: Methyl ethyl ketone zirconia sol (zirconia concentration: 30%)
B-1: Melamine acrylate (NIKALAC MX-302 manufactured by Sanwa Chemical Industries Co., Ltd.)
C-1: Dipentaerythritol hexacrylate
C-2: Pentaerythritol triacrylate
D-1: CYRACURE UVI-6974 manufactured by Union Carbide Corp.
E-1: 1-Hydroxycyclohexyl phenyl ketone
E-2: 2-Methyl-1-[4-(methylthio)phenyl]-2-morpholinopropanone-1

Effect of the Invention

According to the present invention, a curable composition exhibiting excellent applicability and capable of forming a coating (film) with high hardness, high refractive index, superior scratch resistance, and excellent adhesion to substrates as well as a layer with a low refractive index on the surface of various substrates, a cured product of the curable composition, and a laminate with low reflectance and superior chemical resistance can be provided.

What is claimed is:

1. A curable composition comprising:

TABLE 2

|  | Example 1 | Example 2 | Example 3 | Example 4 | Comparative Example 1 | Comparative Example 2 |
|---|---|---|---|---|---|---|
| Reactive particles (A)* |  |  |  |  |  |  |
| A-1 | 76.4 | 76.4 | 66.5 | — | 76.4 | — |
| A-2 | — | — | — | 84.0 | — | — |
| Oxide particles (A1)* |  |  |  |  |  |  |
| A1-1 | — | — | — | — | — | 71.1 |
| Compound (B) |  |  |  |  |  |  |
| B-1 | 5.2 | 5.2 | 10.0 | 4.5 | — | 5.2 |
| Compound (C) |  |  |  |  |  |  |
| C-1 | 18.4 | 18.4 | 18.5 | 7.5 | 23.6 | 23.7 |
| C-2 | — | — | 5.0 | 4.0 | — | — |
| Acid generator (D) |  |  |  |  |  |  |
| D-1 | 4.7 | 4.7 | 4.7 | 4.0 | 4.7 | — |
| Radical polymerization initiator (E) |  |  |  |  |  |  |
| E-1 | — | 1.0 | — | 0.5 | — | 1.0 |
| E-2 | — | 1.0 | — | 0.5 | — | 1.0 |
| Organic solvent |  |  |  |  |  |  |
| MEK | 229.2 | 229.2 | 199.5 | — | 229.2 | 165.9 |
| Isopropanol | — | — | — | 358.1 | — | — |
| Total | 333.9 | 335.9 | 304.2 | 463.1 | 333.9 | 267.9 |
| Nonvolatile component content (%) | 31 | 32 | 34 | 23 | 31 | 38 |
| Characteristics of cured product |  |  |  |  |  |  |
| Pencil hardness | 8H | 8H | 8H | 8H | 8H | 7H |
| Refractive index | 1.69 | 1.69 | 1.67 | 1.59 | 1.69 | 1.69 |
| Adhesion to substrate (%) | 100 | 100 | 100 | 100 | 100 | 100 |
| Adhesion to layer with low refractive index | Good | Good | Good | Good | Bad | Bad |
| SW scratch resistance | Good | Good | Good | Good | Good | Bad |
| Characteristics of laminate |  |  |  |  |  |  |
| Reflectance (%) | 1.0 | 1.0 | 1.1 | 1.4 | 1.0 | 1.0 |
| Chemical resistance | Good | Good | Good | Good | Bad | Bad |

In Table 2, asterisks (*) for reactive particles (A) and oxide particles (A1) indicate the weight of the particles (excluding organic solvents) included in each dispersion sol.

The meanings for the symbols in Table 2 are as follows.

A-1: Dispersion liquid prepared in Preparation Example 1
A-2: Dispersion liquid prepared in Preparation Example 2

(A) particles prepared by bonding at least one oxide of an element selected from the group consisting of silicon, aluminum, zirconium, titanium, zinc, germanium, indium, tin, antimony, and cerium, and an organic compound which comprises a polymerizable group, (B) a compound having a melamine group and one or more polymerizable groups, (C) a compound having at least two polymerizable groups in the molecule other than the component (B), and (D) an acid generator, wherein said acid generator is an aromatic halonium salt.

2. The curable composition according to claim 1, wherein the polymerizable groups of compounds (A), (B) and (C) are polymerizable unsaturated groups.

3. The curable composition according to claim 1, wherein the organic compound included in the particles of the component (A) comprises a group shown by the following formula (1) in addition to the polymerizable unsaturated group:

(1)

wherein X represents NH, O (oxygen atom), or S (sulfur atom), and Y represents O or S.

4. The curable composition according to claim 1, wherein compound B is a melamine (meth)acrylate compound.

5. The curable composition according to claim 4, wherein the melamine (meth)acrylate compound of the component (B) is at least one of the compounds shown by the following formulas (2) and (3):

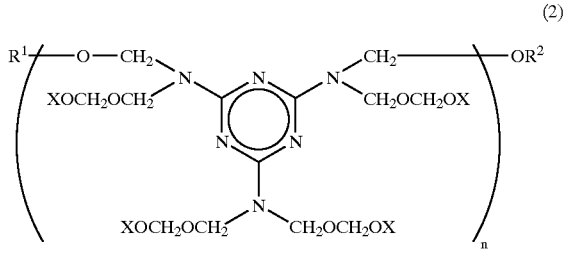

(2)

wherein $R^1$ and $R^2$ represent a $C_1$–$C_{10}$ alkyl group or a (meth)acryloyloxyalkyl group, each X individually represents a $C_1$–$C_{10}$ alkyl group or a (meth)acryloyloxyalkyl group, provided that at least one X among 4n Xs is a (meth)acryloyloxyalkyl group, and n is an integer from 1 to 20;

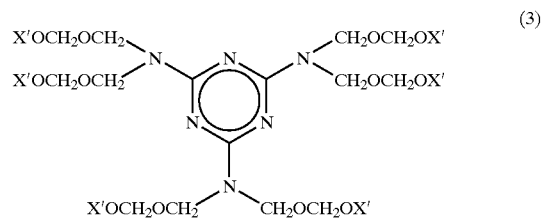

(3)

wherein each X' individually represents a $C_1$–$C_{10}$ alkyl group or a (meth)acryloyloxyalkyl group, with one to five X's among six X's being a lower alkyl group.

6. The curable composition according to claim 1, wherein the melamine (meth)acrylate compound of the component (B) is a condensation product made from
(i) 2-hydroxyethyl acrylate and
(ii) the condensation product of melamine, formaldehyde, and an alkyl monohydric alcohol having 1–12 carbon atoms.

7. The curable composition according to claim 1, wherein the content of compound (B) is from 0.01 to 30 wt % of the total weight of the components (A), (B), and (C).

8. The curable composition according to claim 1, wherein the composition further comprises (E) a radical photoinitiator.

9. A cured product produced by curing the curable composition according to claim 1.

10. Process for producing a laminate comprising:
applying a curable composition as defined in claim 1, on a substrate,
curing the curable composition to form a cured film, and
laminating a film with a low refractive index on the cured film.

11. Laminate obtained by the process of claim 10.

12. The composition of claim 1, wherein said acid generator is selected from the group consisting of aliphatic sulfonic acids, aliphatic sulfonates, aliphatic carboxylic acids, aliphatic carboxylates, aromatic carboxylic acids, aromatic carboxylates, alkylbenzene sulfonic acids, alkylbenzene sulfonates, phosphates, and metal salts.

13. The process of claim 10, wherein said refractive index is in the range of 1.38–1.45.

14. Laminate obtained by the process of claim 13.

15. The laminate of claim 11, wherein said laminate is an antireflection film for film-type liquid crystal elements, touch panels, or plastic optical parts.

16. The laminate of claim 14, wherein said laminate is an antireflection film for film-type liquid crystal elements, touch panels, or plastic optical parts.

* * * * *